US006967355B2

(12) United States Patent
Kryliouk et al.

(10) Patent No.: US 6,967,355 B2
(45) Date of Patent: Nov. 22, 2005

(54) GROUP III-NITRIDE ON SI USING EPITAXIAL BP BUFFER LAYER

(75) Inventors: Olga Kryliouk, Gainesville, FL (US);
Tim Anderson, Gainesville, FL (US);
Omar J. Bchir, Gainesville, FL (US);
Kee Chan Kim, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 10/691,055

(22) Filed: Oct. 22, 2003

(65) Prior Publication Data

US 2005/0087746 A1  Apr. 28, 2005

(51) Int. Cl.$^7$ ............................................. H01L 33/00
(52) U.S. Cl. ........................ 257/103; 257/190; 438/46
(58) Field of Search ............................. 257/103, 190; 438/46, 47

(56) References Cited

U.S. PATENT DOCUMENTS 4,579,609 A * 4/1986 Reif et al. .................... 117/97
6,069,021 A * 5/2000 Terashima et al. ............. 438/46

OTHER PUBLICATIONS

Kumashiro, Y. et al., "Epitaxial growth of rhombohedral boron phosphide singel crystalline films by chemical vapor deposition," Journal of Solid State Chemistry, 133, 104-112 (1997), pp 104-112.*
Nikishin et al., "High quality GaN grown on Si(111) by gas source molecular beam epitaxy with ammonia," Applied Physics Letters, 75:2073-2075, 1999.
Zhang et al., "Enhanced optical emission from GaN films grown on a silicon substrate," Applied Physics Letters, 74:1984-1986, 1999.
Linthicum et al., "Process Routes for Low Defect-Density Gan on Various Substrates Employing Pendeo-Epitaxial Growth Techniques," MRS Internet J. Nitride Semicond. Res. 4S1, G4.9, 1999.
Strittmatter et al., "Low-pressure metal organic chemical vapor deposition of GaN on silicon(111) substrates using an AlAs nucleation layer," Applied Physics Letters, 74:1242-1244, 1999.
Sanchez-Garcia et al., "Ultraviolet electroluminescence in GaN/AlGaN single-heterojunction light-emitting diodes grown on Si(111)," Journal of Applied Physics, 87:1569-1571, 2000.
Nishimura et al., "Growth of GaN on Si substrates-roles of BP thin layer," Optical Materials, 19:223-228, 2002.
Nishimura et al., "Low temperature growth interface for growing Boron Monophosphide on Si substrates," Applied Surface Science, 159-160:288-291, 2000.
Nishimura et al., "Growth of c-GaN on Si(100)," Materials Science and Engineering, B82:25-26, 2001.
Izumiya et al., "Growth of BP and GaN/BP hetero-structures," Procceding of the 19th International Symposium on Gallium Arsenide and Related Compounds, 157-162, 1993.

(Continued)

*Primary Examiner*—Sara Crane
(74) *Attorney, Agent, or Firm*—Akerman Senterfitt

(57) ABSTRACT

A semiconductor device and method for forming the same includes a silicon (111) single crystal substrate, and an epitaxial boron phosphide (BP) layer disposed on the substrate. A group III-nitride semiconductor epitaxial layer is disposed on the BP epitaxial layer.

15 Claims, 2 Drawing Sheets

OTHER PUBLICATIONS

Nishinaga et al., "Effect of Growth Parameters on the Epitaxial Growth of BP on Si Substrate," Japanese Journal of Applied Physics, 14:753-760, 1975.
Landolt-Bornstein, "Semiconductors," 3:14-28 and 43-50.
Welker et al., "Solid State Physics," Group III-Group V Compounds, 1-78, 1956.
Johnson, S., "Chapter 3 Growth of BP by CVD" Ph.D. Thesis, 2001.
Terashima et al., "Proceedings of the 8th International Symposium on Silicon Materials Science and Technology," 2:44-45, 1998.

* cited by examiner

GROUP III-NITRIDE ON Si USING EPITAXIAL BP BUFFER LAYER

CROSS-REFERENCE TO RELATED APPLICATIONS

Not applicable.

STATEMENT REGARDING FEDERALLY SPONSORED RESEARCH OR DEVELOPMENT

Not applicable.

FIELD OF THE INVENTION

The invention relates to the field of thin film based devices, and more specifically, to a method of improving the quality of Group III-N thin films which have poor lattice matching with the substrate onto which they are deposited, and related articles.

BACKGROUND OF THE INVENTION

Group III-N compounds, such as gallium nitride (GaN) and its related alloys have been under intense research in recent years due to their promising applications in electronic and optoelectronic devices. Particular examples of potential optoelectronic devices include blue light emitting and laser diodes, and UV photodetectors. Their large bandgap and high electron saturation velocity also make them excellent candidates for applications in high temperature and high-speed power electronics.

Due to the high equilibrium pressure of nitrogen at typical growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material which exhibits close lattice matching and close matching of thermal expansion coefficients.

SiC is a semiconducting material which provides excellent thermal conductivity, but is very expensive and available only in small wafer sizes. Direct growth of GaN on SiC is generally difficult due to poor wetting between these materials. Although buffer layers, such as AlN or AlGaN, can be used to address this wetting problem, such layers increase the resistance between the device and the substrate. In addition, it is very difficult to prepare a SiC layer having a smooth surface. A rough interface with GaN can cause an increase in defect density of the GaN layer.

Presently, (0001) oriented sapphire is the most frequently used substrate for GaN epitaxial growth due to its low price, availability of large-area wafers with good crystallinity and stability at high temperatures. However, the lattice mismatch between GaN and sapphire is over 13%. Such a huge mismatch in the lattice constants causes poor crystal quality if GaN films were to be grown directly on the sapphire, due to stress formation and a high density of defects, including such defects as microtwins, stacking faults and deep-levels. Sapphire is also an electrical insulator. Use of electrically insulating substrates can complicate processing by requiring additional processing steps, as compared to a conducting or semiconducting substrate, due to the inability to make an electrical contact through the substrate.

The most highly refined semiconductor substrate in the world are silicon wafers. Silicon is increasingly being used as a substrate for GaN materials. Silicon substrates have been considered for use as substrates for growth of GaN films. Silicon substrates for GaN growth is attractive given its low cost, large diameter, high crystal and surface quality, controllable electrical conductivity, and high thermal conductivity. The use of Si wafers promises easy integration of GaN based optoelectronic devices with Si based electronic devices.

The disadvantages of Si as a substrate for GaN heteroepitaxy include a +20.5% a-plane misfit which initially led to the conclusion that growth of GaN directly on silicon was not likely to work well. In addition, the thermal expansion misfit between GaN ($5.6 \times 10^{-6}$ $K^{-1}$) and Si ($6.2 \times 10^{-6}$ $K^{-1}$) of 9.6% can lead to cracking upon cooling in films grown at high temperature. Thus, direct growth of GaN on substrates including Si has been found to result in either polycrystalline growth, substantial diffusion of Si into the GaN film and/or a relatively high dislocation density (e.g. $10^{10}$ $cm^{-2}$). Moreover, GaN is also known to poorly nucleate on Si substrate, leading to an island-like GaN structure and poor surface morphology. Thus, the quality of GaN films grown on silicon has been far inferior to that of films grown on other commonly used substrates such as sapphire or silicon carbide. Moreover, the growth conditions that have been used for GaN on Si are generally not compatible with standard silicon processes.

Numerous different buffer layers have been disclosed for insertion between the Si substrate and the GaN layer to relieve lattice strain and thus improve GaN crystal quality. However, even when buffer layers are used, typically the effect of the thermal expansion coefficient mismatch is too large to suppress the formation of cracks in the GaN and related other Group III-N films grown. Thin AlN, GaAs, AlAs, SiC, $SiO_2$, $Si_3N_4$ and ZnO, boron monophosphide (BP) or low-temperature GaN layers are exemplary buffer layers which have for GaN growth on Si.

BP has a zinc blende crystal structure with a lattice constant of 4.5383 Å at room temperature. The lattice mismatch between GaN and BP is less than 0.6%. BP has 16% lattice mismatch to Si, but boron and phosphorous have a high affinity to Si as evidenced by their use as common dopants in bulk Si. BP is a stable material. The sublimation temperature of BP is greater than 1130° C. Physical properties of GaN, BP and Si are given in Table 1.

TABLE 1

Physical properties of GaN, BP and Si

| Property | GaN | BP | Si |
|---|---|---|---|
| Crystal Structure | Wurtzite | Zincblende | Diamond |
| Lattice Constant (Å) | a = 3.210<br>c = 5.237 | 4.537 | 5.431 |
| Band Gap (eV) | 3.4 | 2.3 | 1.1 |

TABLE 1-continued

Physical properties of GaN, BP and Si

| Property | GaN | BP | Si |
|---|---|---|---|
| Crystal Structure | Wurtzite | Zincblende | Diamond |
| Band Transition | Direct | Indirect | Indirect |
| Conductivity Types | p, n | p, n | p, n |
| Electrical Resistivity ($\Omega$ - cm) | $10^{-3} - 10^{-2}$ | $10^{12}$ | $10^5$ |
| Density (g/cm$^3$) | 6.10 | 2.40 | 2.33 |
| Hardness (GPa) | N/A | 30–35 | 11 |
| Melting Temperatures (° C.) | 782 (sublimates at 1 atm) | 1130 (decomp. to $B_{13}P_2$) | 1410 |
| Thermal Expansion Coefficient ($K^{-1} \times 10^{-6}$) | 5.6 | 4.0 | 2.9 |
| Thermal Conductivity ($K^{-1}$) | 1.3 | 3.5 | 1.5 |

BP is known as a buffer material for Si(100) substrates. However, GaN grown on BP on single crystal Si (100) has been mainly cubic, with significant evidence of mixed phases. For example, Nishimura, et al., Growth of c-GaN on Si (100) Materials Science and Engineering B82 (2001) 25–26 reports mainly cubic mixed phase GaN on BP/Si (100).

BP has not generally been reported to be a buffer material for III-nitride semiconductors, such as GaN, on Si(111). However, U.S. Pat. No. 6,069,021 to Terashima et al. discloses formation of a boron phosphide-base semiconductor layer using a silicon single crystal having a surface of either a {100} or {111} crystal plane as the substrate. This reference teaches that BP directly grown on a Si single crystal substrate at a temperature exceeding 700° C. becomes a discontinuous layer of pyramid-like BP crystal islands scattered over the silicon surface. It is concluded therein that a single BP layer formed at a temperature higher than 700 C is therefore not effective as a buffer layer for GaN growth on Si.

To overcome the lattice mismatch between {111} crystal planes of the silicon single crystal and that of BP, a two buffer layer stack is disclosed in U.S. Pat. No. 6,069,021. The first buffer layer deposited on the Si substrate is disclosed as being polycrystalline or amorphous and is said to provide strain relief. A second BP buffer layer is referred to as being "single crystal" and is deposited on the first buffer layer.

In another approach, U.S. Pat. App. No. 20030047795 discloses a semiconductor device having a silicon single crystal substrate and a {110} boron phosphide semiconductor layer containing boron and phosphorus as constituent elements on a surface of the silicon single crystal substrate. The surface of the silicon single crystal substrate is a {111} crystal plane inclined at an angle of 5.0 to 9.0 degrees toward a <110> crystal azimuth. However, as with U.S. Pat. No. 6,069,021, the BP buffer layer includes an amorphous portion, such as a major part being amorphous, such as disclosed in Example 1.

SUMMARY OF THE INVENTION

A semiconductor device includes a silicon (111) single crystal substrate, and an epitaxial and single crystal boron phosphide (BP) comprising buffer layer disposed on the Si substrate. A group III nitride semiconductor epitaxial layer, such as GaN, is disposed on the BP epitaxial layer. The GaN layer is preferably also single crystal. The BP buffer layer can have a thickness in the range of 0.1–1.0 μm.

As used herein, the term "single crystal" as applied to both the BP comprising buffer layer and the group III-nitride layer refers to a layer which provides a full width half maximum (FWHM) X-ray ω-scan rocking curve of no more than 10 arc-min, more preferably less than 8 arc-min, and most preferably less than 7 arc-min.

A light-emitting diode (LED) includes a silicon (111) single crystal substrate and an epitaxial and single crystal boron phosphide (BP) comprising layer on the substrate. A group III-nitride semiconductor epitaxial layer is disposed on the BP layer, and an active layer comprising $In_xGa_{1-x}N$, wherein $0 \leq X \leq 1$, on the group III-nitride layer. The group III-nitride layer can comprise GaN. Significantly, because both the BP buffer layer and silicon substrate are semiconducting, one terminal of the LED can be contacted via the silicon substrate. The LED preferably includes a first and second cladding layer sandwiching the active layer. The active layer can include $In_xGa_{1-x}N$, or variants thereof.

A method for forming group III-nitride articles includes the steps of providing a single crystal (111) silicon substrate, depositing an epitaxial boron phosphide (BP) comprising layer on the substrate, and depositing an epitaxial group III-nitride semiconductor epitaxial layer on the BP layer. The BP layer is preferably single crystal. The group III-nitride layer can be single crystal GaN. The method preferably includes the step of in-situ removal of native oxide on a surface of the Si substrate in the same reactor used for depositing BP, prior to depositing BP. The in-situ removal preferably comprises hydrogen reduction.

BRIEF DESCRIPTION OF THE DRAWING

A fuller understanding of the present invention and the features and benefits thereof will be accomplished upon review of the following detailed description together with the accompanying drawings, in which.

DETAILED DESCRIPTION OF THE INVENTION

A semiconductor device includes a silicon (111) single crystal substrate, and an epitaxial boron phosphide (BP) layer disposed on the substrate. The term "epitaxy" and resulting "epitaxial layer" is understood to refer to a process and resulting arrangement in which a layer of single crystal material is produced having an orientation which is guided by the crystal orientation provided by the single crystal substrate. Epitaxial growth occurs such that the crystallographic structure of the substrate is reproduced in the growing material, including substrate defects which are generally reproduced in the growing material.

The BP comprising epitaxial layer is preferably single crystal. The BP layer can be doped or undoped. Generally, an undoped BP layer according to the invention will be suitable for most applications.

A group III nitride semiconductor epitaxial layer, such as GaN, is disposed on the BP epitaxial layer. The group III nitride layer is preferably and generally a single crystal layer. The invention is generally described relative to semiconducting articles including GaN. However, other Group III-N species, such as AlN, InN and their alloys, as well as GaN alloys, can generally be used with the invention. Since the BP comprising buffer layer is (111), the resulting GaN layer or other group III-nitride layer will be hexagonal.

Remove of effectively all the native oxide on the silicon surface was determined to be an important process step prior to BP deposition. Optimal BP growth was found to occur when the Si substrate was cleaned in warm trichloroethylene (TCE)/acetone/methanol and etched for one minute in dilute HF, such as 1% HF. This is preferably followed by an in-situ hydrogen reduction (e.g. 4% $H_2$ in $N_2$) for ten minutes at or near the BP epitaxial growth temperature, such as at 1000° C. for an 1100° C. BP deposition process. The hydrogen reduction conditions are chosen to preferably remove the entire native oxide layer on the Si substrate remaining after the solution clean/etch described above. The thickness of the BP layer deposited is typically about 0.5–1 $\mu$m, and is preferably in the range of 0.1–1.0 $\mu$m.

A Group III-N layer is then epitaxially deposited on the BP layer. A H-MOVPE growth technique is preferably used for the deposition of high structural quality epitaxial single crystal GaN on the BP buffer layer. The Group III-N deposition temperature is generally in the range from 560° C. to 950° C.

The invention can be used to form a variety of discrete or integrated devices. For example, diodes, transistors, optical and optoelectronic devices or integrated circuits including the same can be formed using the invention.

The BP buffer layer is an electrically conductive layer. Combined with a silicon substrate, the BP buffer layer permits formation of simplified processing as compared to prior art processes, such as demonstrated below for a GaN-based LED.

Figure 1:
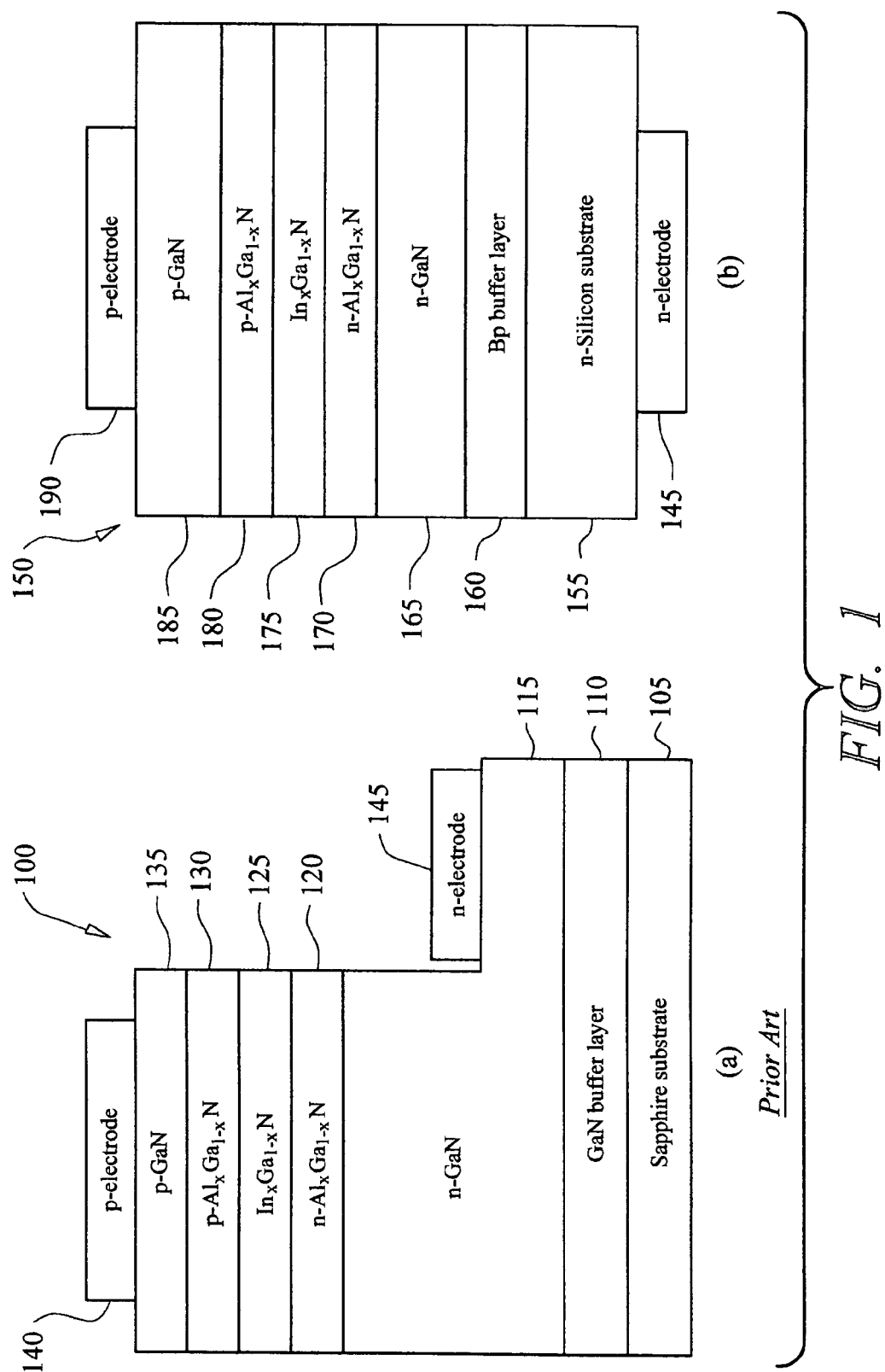
FIG. 1(a) shows a prior art GaN LED.
FIG. 1(b) shows a GaN LED according to an embodiment of the invention.

FIG. 1($a$) shows a prior art GaN-based LED 100 on a sapphire substrate 105. A buffer layer 110 is disposed between the substrate 105 and an n-GaN layer 115. An n-$Al_xGa_{1-x}$N cladding layer 120 is shown on the GaN layer 115. An $In_xGa_{1-x}$N active layer 125 is disposed on $Al_xGa_{1-x}$N layer 120. An $Al_xGa_{1-x}$N cladding layer 130 is disposed on the $In_xGa_{1-x}$N later 125. A p-GaN layer 135 is disposed on the AlxGa$_y$N cladding layer 130. Contact to p-GaN layer 135 is provided by p-electrode 140. Since the sapphire substrate 105 is electrically insulating, even though buffer layer 110 may be electrically semiconducting or conducting, a contact to n-GaN layer 115 via n-electrode 145 requires etching a contact through layers 135, 130, 125 and 120. The etching process required significant added processing cost and process complexity as compared to LED 150 shown in FIG. 1($b$).

FIG. 1($b$) show an LED 150 on a silicon substrate 155, according to an embodiment of the invention. An electrically conductive buffer layer 160, such as epitaxial BP layer is disposed between substrate 155 and n-GaN layer 165. An n-$Al_xGa_{1-x}$N cladding layer 170 is shown on the GaN layer 165. An $In_xGa_{1-x}$N active layer 175 is disposed on $Al_xGa_{1-x}$N layer 170. A$_n$$Al_xGa_{1-x}$N cladding layer 180 is disposed on the $In_xGa_{1-x}$N layer 175. A p-GaN layer 185 is disposed on the $Al_xGa_{1-x}$N cladding layer 180. Contact to p-GaN layer 185 is provided by p-electrode electrode 190. Since the silicon substrate 155 and buffer layer 160 are both at least semiconducting, n-electrode contact layer 195 can be disposed on silicon substrate 155, such as using a backside contact. Thus, the etching process discussed relative to LED 100 shown in FIG. 1($a$) is not required. This arrangement can significantly reduce processing cost and process complexity, and likely improve performance, as compared to LED 100 shown in FIG. 1($a$).

EXAMPLE

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

Commercial Si (111) substrates were provided. The Si substrates were first cleaned in warm trichloroethylene (TCE)/acetone/methanol and etched for one minute in dilute HF, such as 1% HF. The wafers were loaded into a reactor. Prior to BP growth, in-situ hydrogen reduction (e.g. 4% $H_2$ in $N_2$) was performed for ten minutes at or near the BP epitaxial growth temperature, such as at 1000° C. for an 1100° C. BP deposition process to remove the native oxide on the surface of the silicon substrate.

CVD of epitaxial BP on Si (111) was performed using boron trichloride ($BCl_3$, 99.5% purity, Matheson) and phosphorus trichloride ($PCl_3$, 99.99% purity, Johnson-Matthey) precursors, diluted in hydrogen ($H_2$, 99.99% purity, Linde) at a temperature in the range from 850 to 1100° C. The reactor pressure was varied from 10 to 760 Torr. Flowrates of the precursors were varied from 0.25 to 2.0 sccm and 0.5 to 4.0 sccm for $BCl_3$ and $PCl_3$, respectively, while total flowrates were varied from 250 to 1000 sccm. $H_2$, $N_2$, He, and/or Ar were used as a carrier gases. Typical deposition time was 30 min. Standard deposition parameters were T=1000° C., P=760 Torr, $F_{BCl3}$=1 sccm, $F_{PCl3}$=1 sccm and deposition time 30 min. A typical BP growth rate under these conditions was 2 $\mu$m/hr.

Figure 2:
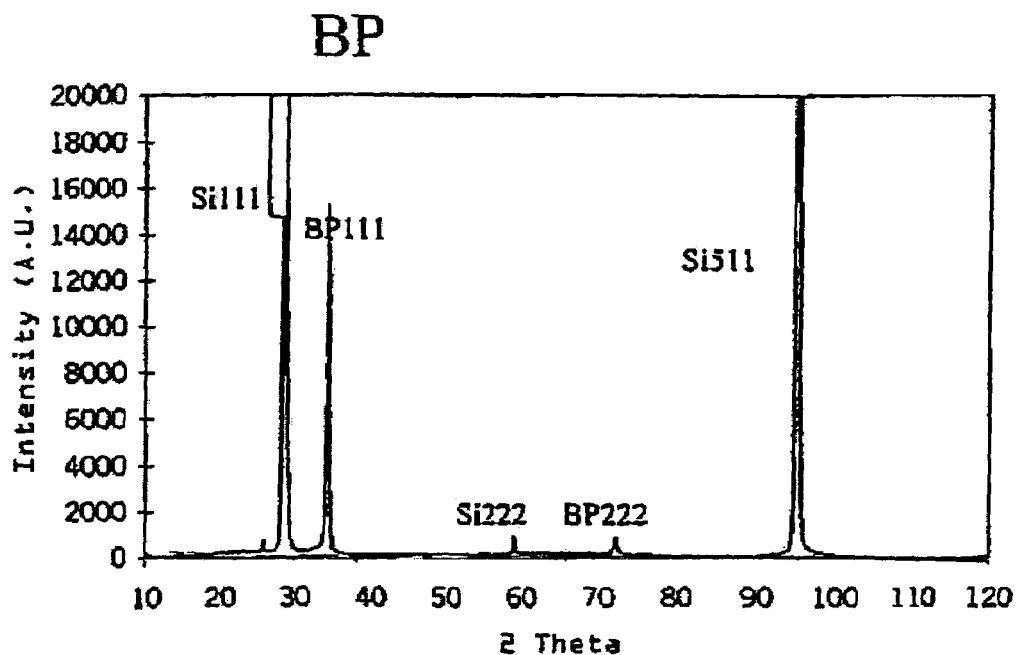
FIG. 2 is a low resolution X-ray diffraction (LRXRD) spectra of epitaxial BP single crystal Si(111) showing a single phase BP (111) layer.

FIG. 2 is a low resolution X-ray diffraction (LRXRD) spectra of epitaxial BP grown on single crystal Si(111) showing BP peaks at only (111) and (222). This demonstrates that the BP epitaxial layer is indeed single phase.

GaN was then epitaxially grown on the (111) epitaxial BP layer/Si (111) substrate. In some cases, the GaN layer was grown in an alternate reactor that is a traditional cold-wall, low-pressure system, referred herein as a MOVPE reactor. Growth conditions for the GaN films were as follows: pressure: MOCVD @ 760 Torr, Hydride Vapour Phase Epitaxy (HVPE) @ 760 Torr, MOVPE @ 76 Torr; V/III reactant ratio: MOCVD 3000, HVPE 125, MOVPE 3000, growth temperature: MOCVD 560 to 900° C., HVPE 560 to 950° C., MOVPE 560 to 850° C.

Figure 3:
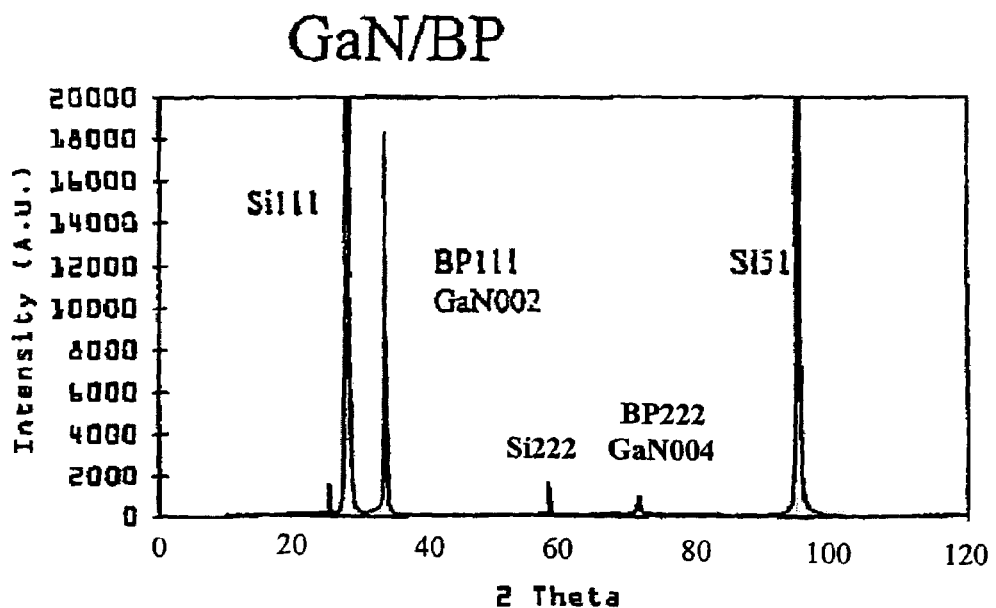
FIG. 3 is a LRXRD spectra of GaN grown on a BP buffer layer on Si (111) at T=850° C. showing a single hexagonal phase GaN layer.

FIG. 3 shows a single GaN peak which is superimposed on the BP peak. The single GaN peak demonstrates that single phase hexagonal GaN layer was grown on the BP/Si substrate. Typical FWHM X-ray ω-scan rocking curves for the single crystal GaN epitaxial layer was about 6.5 arc-min. Thus, an article comprising a hexagonal (0001) single crystal GaN layer on a single crystal (111) BP layer on a single crystal Si (111) substrate has been demonstrated.

It should be understood that the examples and embodiments described herein are for illustrative purposes only and that various modifications or changes in light thereof may be made by persons skilled in the art without departing from the scope of the present claims.

What is claimed is:

1. A semiconductor device, comprising:
   a silicon (111) single crystal substrate;
   a single crystal epitaxial boron phosphide (BP) comprising layer disposed directly on said substrate, and
   a group III-nitride semiconductor epitaxial layer disposed directly on said BP layer.

2. The device of claim 1, wherein said group III-nitride layer comprises GaN.

3. The device of claim 2, wherein said GaN layer is single crystal.

4. The device of claim 1, wherein said buffer layer has a thickness in the range of 0.1–1.0 μm.

5. A light-emitting diode (LED), comprising:
   a silicon (111) single crystal substrate;
   a single crystal epitaxial boron phosphide (BP) comprising layer disposed directly on said substrate;
   a group III-nitride semiconductor epitaxial layer on said BP layer, and
   an active layer comprising $In_xGa_{1-x}N$ disposed directly on said group III-nitride layer.

6. The LED of claim 5, wherein said BP layer is a single crystal.

7. The LED of claim 5, wherein said group III-nitride layer comprises GaN.

8. The LED of claim 5, wherein one terminal of said LED is contacted through said silicon substrate.

9. The LED of claim 5, father comprising a first and second cladding layer sandwiching said active layer.

10. The LED of claim 5, wherein said active layer comprises $In_xGa_{1-x}N$, wherein $0 \leq X \geq 1$.

11. A method for forming group III-nitride articles, comprising the steps of:
    providing a single crystal (111) silicon substrate,
    depositing a single crystal epitaxial boron phosphide (BP) comprising layer disposed directly on said substrate, and
    depositing an epitaxial group III-nitride semiconductor epitaxial layer disposed directly on said BP layer.

12. The method of claim 11, wherein said BP layer is a single crystal.

13. The method of claim 11, wherein said group III-nitride layer comprises single crystal GaN.

14. The method of claim 11, further comprising the step of in-situ removal of native oxide on a surface of said Si substrate in a reactor used for depositing said BP prior to depositing said BP.

15. The method of claim 14, wherein said in-situ removal comprises hydrogen reduction.

* * * * *